United States Patent
Narayanasamy

(10) Patent No.: US 11,870,338 B1
(45) Date of Patent: Jan. 9, 2024

(54) DEAD TIME ADJUSTED PULSE WIDTH MODULATOR

(71) Applicant: Texas Instruments Incorporated, Dallas, TX (US)

(72) Inventor: Navaneeth Kumar Narayanasamy, Sugarland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/876,170

(22) Filed: Jul. 28, 2022

(51) Int. Cl.
 *H02M 1/38* (2007.01)
 *H02M 1/08* (2006.01)
 *H02M 7/5395* (2006.01)
 *H02M 1/00* (2006.01)

(52) U.S. Cl.
 CPC ........... *H02M 1/38* (2013.01); *H02M 1/0009* (2021.05); *H02M 1/08* (2013.01); *H02M 7/5395* (2013.01)

(58) Field of Classification Search
 CPC ....................................................... H02M 1/38
 USPC ......................................................... 327/41
 See application file for complete search history.

(56) References Cited

U.S. PATENT DOCUMENTS

| 6,614,208 | B2 | 9/2003 | Narita |
| 10,547,236 | B1 * | 1/2020 | Ramamoorthy .. H02M 7/53871 |
| 2007/0296368 | A1 | 12/2007 | Woodland |
| 2021/0376761 | A1 | 12/2021 | Bakan |

OTHER PUBLICATIONS

Weerakoon, D., et al., "A Novel Dead-Time Compensation Scheme for PWM VSI Drives," IEEE International Conference on Information and Automation for Sustainability (ICIAFS), IEEE, Dec. 16, 2016, 6 pages.
International Search Report dated Nov. 2, 2023, PCT Application No. PCT/US2023/070298 filed Jul. 17, 2023, 4 pages.
Written Opinion dated Nov. 2, 2023, PCT Application No. PCT/US2023/070298 filed Jul. 17, 2023, 8 pages.

* cited by examiner

*Primary Examiner* — Tomi Skibinski
(74) *Attorney, Agent, or Firm* — Krista Y. Chan; Frank D. Cimino

(57) ABSTRACT

A pulse width modulator circuit with circuitry for providing a first and second pulse width modulation signal with dead time periods between the first and second pulse width modulation signals, an input for receiving a signal representative of a current in a load adapted to be driven in response to the first and second pulse width modulation signals, and circuitry coupled to the input for adjusting the dead time periods in response to the signal representative of a current.

20 Claims, 8 Drawing Sheets

DEAD TIME ADJUSTED PULSE WIDTH MODULATOR

CROSS-REFERENCE TO RELATED APPLICATION

Not applicable.

BACKGROUND

The described examples relate to electronic circuits and more particularly to a pulse width modulator with dead time adjustment.

Pulse width modulation (PWM) is used in various categories of electronic circuits and devices, including by example voltage converters, such as voltage source inverters (VSI). A VSI converts a direct current (DC) voltage to an alternating current (AC) waveform. In a PWM VSI, a single-phase or three phase AC waveform is created by switching a DC signal on and off to create a PWM output at a frequency faster than the desired output AC voltage, and the PWM output is filtered to approximate and produced the desired AC voltage. The duty cycle of the PWM output is adjusted to vary the magnitude of the output AC voltage. Additionally, the preceding describes a single phase AC voltage, while in some systems plural AC voltages may be likewise generated. For example, in a three-phase system, three different AC voltages are generated, each 120 degrees out of phase with respect to the other two, in which case the above may be triplicated, so as to produce each of the three respective AC signals. In any event, in a typical single phase circuit, or in each portion (leg) of a multiple phase circuit, a typical rail-to-rail circuit path in the PWM switching configuration includes two switches, a first connected to a relatively high voltage and a second connected to a relatively low voltage, with the switches enabled in complementary fashion, that is, with only the first or second switch enabled (on and conducting) at a time. Effort is typically made (or required) to ensure that the first and second switch cannot conduct at the same time, a condition sometimes referred to as shoot-through, which would short circuit one rail to the other. To prevent this condition, a so-called dead (or blanking) time is inserted between the period where one of the two switches is enabled and the period where the other of the two switches is enabled, so that during the dead time, both switches are disabled.

While dead time insertion reduces the risk of shoot-through, it also has certain drawbacks. For example, the dead time duration may be calculated based on certain circuit expectations, so a conservatively long dead time may be included, which can bring commensurate drawbacks from the duration. Particularly, dead time insertion typically introduces waveform distortion and fundamental voltage gain or loss in a VSI, so an extended dead time can increase these effects. Certain approaches have been taken to adjust errors or to reduce negative effects due to dead time insertion, for example as are shown in U.S. Pat. No. 10,547,236 entitled, "Dead Band Compensation," issued Jan. 28, 2020, co-owned with the present application, and hereby incorporated herein by reference. Some others also may increase the circuit size, and corresponding cost, in the use of additional external sensors in connection with evaluating and adjusting the dead time insertion.

Examples are provided in this document that may improve on various of the above considerations as well as other concepts, as further detailed below.

SUMMARY

In one example, there is a pulse width modulator circuit with circuitry for providing a first and second pulse width modulation signals with dead time periods between the first and second pulse width modulation signals, an input for receiving a signal representative of a current in a load adapted to be driven in response to the first and second pulse width modulation signals, and circuitry coupled to the input for adjusting the dead time periods in response to the signal representative of a current.

Other aspects are also disclosed and claimed.

DETAILED DESCRIPTION

Figure 1:
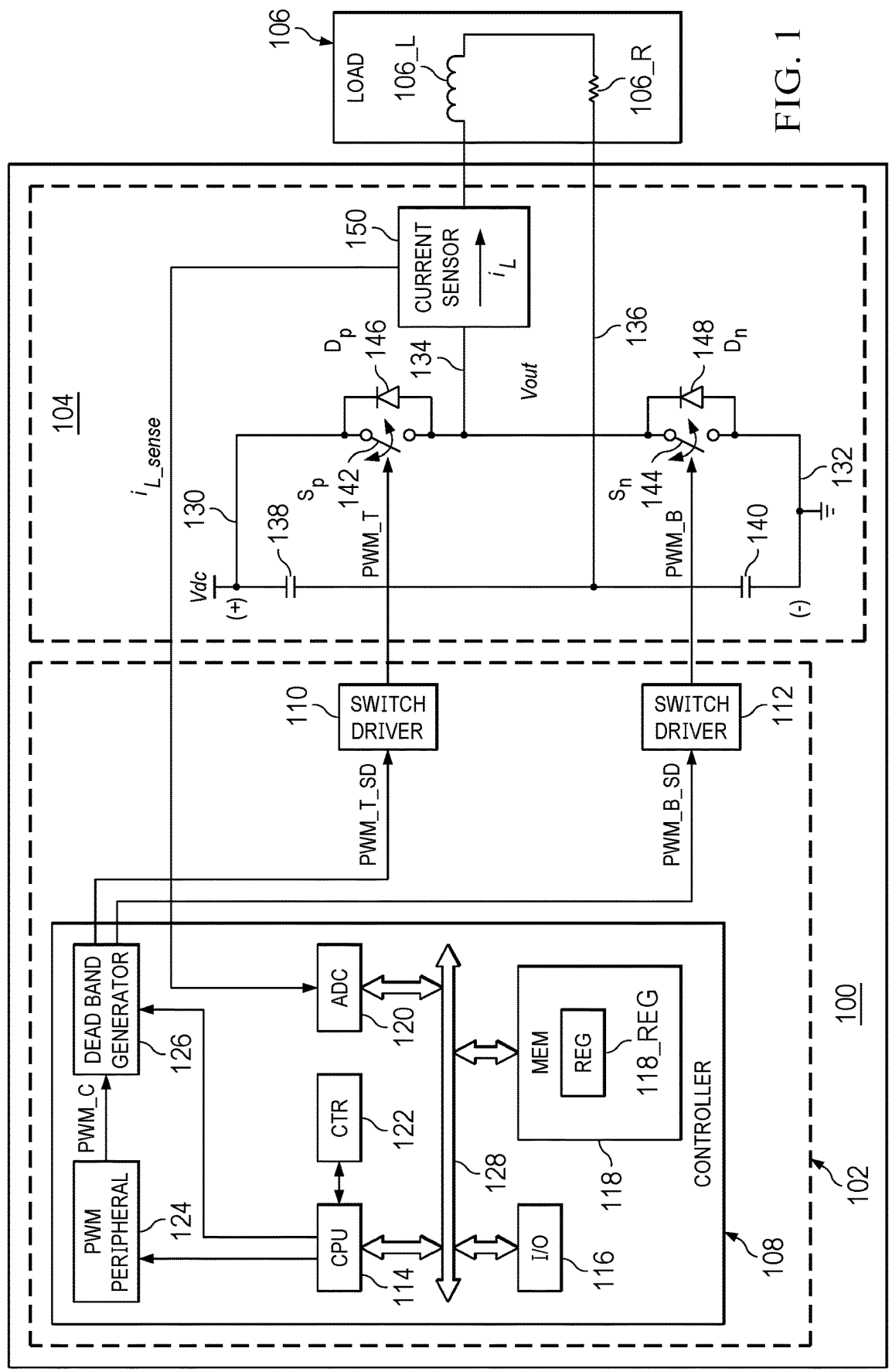
FIG. 1 is an example of a VSI.

FIG. 1 is a voltage source inverter (VSI) 100, as an example of a system implementing PWM dead time adjustment. The VSI 100 may be implemented as one or more integrated circuit (IC) devices and with various functional/structural boundaries. In FIG. 1, the VSI 100 includes a pulse width modulator 102 and an inverter 104 switched by the pulse width modulator 102, and together they drive a load 106. By way of example, the load 106 may include an inductor 106_L and resistor 106_R, connected in series. In some other examples, the load could be a motor like an induction motor, permanent magnet synchronous motor and various other types.

The pulse width modulator 102 includes a controller 108 and a first and second switch driver 110 and 112. The controller 108 may be implemented by a multiple bit microcontroller, for example as is commercially available from Texas Instruments Incorporated in various forms (e.g., a C2000). The controller 108 may include various internal functional blocks, typically integrated and assembled into a single IC package. For example, FIG. 1 illustrates the controller 108 to include a central processing unit (CPU) 114, an input/output (I/O) interface 116, a memory 118 which may include various forms of storage, including a section to provide a register file 118_REG, one or more levels (e.g., cache) of data/programming storage, and an analog-to-digital converter (ADC) 120. Further in connection with PWM functionality, the controller 108 also includes a counter 122 bidirectionally coupled to the CPU 114, a PWM peripheral 124 coupled to receive signaling from the CPU 114, and a dead band generator 126 coupled to receive a control signal PWM_C from the PWM peripheral 124, and to output a PWM_T_SD signal to the first switch driver 110 and a PWM_B_SD signal to the second switch driver 112 (the use of "T" and "B" to suggest top and bottom, respectively, corresponding to the general switching architecture of the inverter 104). Some or all of these controller blocks may be coupled to communicate with a system bus 128, and by which various of these blocks can communicate with one another or externally, for example via the I/O interface 116. The CPU 114 typically includes structure and function commensurate with the computational needs for applications for which the controller 108 is designed and specified. With respect to the PWM functionality, generally programming is stored in a media that is readable by the CPU 114, for example that media being the memory 118, and such programming when executed by the CPU 114 generates PWM-implementing control signals. For example, the CPU 114 controls the PWM peripheral 124 to output a pulse width modulated signal, PWM_C. In response to and generally synchronized to PWM_C, the dead band generator 126 outputs generally complementary signals PWM_T_SD and PWM_B_SD, respectively, to the first and second switch drivers 110 and 112, but in addition to the general synchronization to PWM_C, an additional dead time is inserted between the alternating times when either of the PWM_T_SD and PWM_B_SD is high, ensuring that there are periods (dead times) when both of these signals are low. The dead time inserted by the dead band generator 126 can be programmable by the CPU 114 and may be determined using various methodologies. For example, the CPU 114 can write values into a register or registers in the dead band generator 126, from which the dead band generator 126 can support independent values for either rising edge and falling edge delays, relative to PWM_C, in the signal transitions of PWM_T_SD and PWM_B_SD, in order to adjust both the overall total dead time as well as the timing of a dead time before or after a signal transition. The width of the pulse to be generated is computed and written to the PWM peripheral 124 by the CPU 114 based on specific methodologies. In some examples, the methodology includes field-oriented motor control and in other examples it may refer to current or voltage mode control. Each of the first and second switch drivers 110 and 112 include circuitry operable to receive a respective one of PWM_T_SD and PWM_B_SD and to convert it to a sufficiently strong and respective signal, PWM_T and PWM_B, to operate a switching operation, detailed below. Accordingly, the first and second switch drivers 110 and 112 may include one or more configured power transistors (e.g., metal oxide field effect transistors) configured to trigger according to the respective digital state of PWM_T_SD and PWM_B_SD, for example such that generally, while modified as described below, when PWM_T_SD is asserted (e.g., active high), the first switch driver 110 asserts the corresponding driving control signal PWM_T, and when PWM_B_SD is asserted (e.g., active high), the second switch driver 112 asserts a corresponding driving control signal PWM_B. Accordingly, in general, the controller 108 may implement the PWM operation by adjusting the timing and duration of each period it asserts PWM_T_SD and PWM_B_SD. Further, these signals are controlled to never be simultaneously on, and the period where both are at logic zero is called dead time, giving rise to the terminology of the dead band generator 126. The duration of this dead time is programmable and is calculated based on characteristics of the inverter 104. The controller 108 may use modulation techniques like vector control or sine triangle control to generate the PWM signals PWM_T_SD and PWM_B_SD. In some examples, the dead band generator 126 can be part of the PWM peripheral 124.

The inverter 104 includes couplings and circuitry for adapting the received driving control signal PWM_T and PWM_B to convert a DC voltage difference into an approximated analog output voltage Vout, which is coupled to the load 106. In the illustrated example, the DC voltage difference is between a relatively high voltage, shown as Vdc, and a relatively low voltage, shown as ground. More particularly, a first node 130 is connected to receive Vdc, and a second node 132 is connected to ground. A third node 134 provides a first output voltage signal, and a fourth node 136 provides a second output voltages signal, with Vout as the difference between the third node 134 and the fourth node 136 and the load 106 coupled between the third and fourth nodes 134 and 136 (and thereby to receive Vout). A first capacitor 138 has a first terminal connected to the first node 130 and a second terminal connected to the fourth node 136, and thereby during switching provides a voltage +Vdc/2. A second capacitor 140 has a first terminal connected to the fourth node 136 and a second terminal connected to the second node 132, and thereby during switching provides a voltage −Vdc/2. A positive side switch $S_p$ 142 has a first terminal connected to the first node 130 and a second terminal connected to the third node 134, where the switch $S_p$ 142 is controlled to open and close by PWM_T, which responds to PWM_T_SD. A negative side switch $S_n$ 144 has a first terminal connected to the third node 134 and a second terminal connected to the second node 132, where the switch $S_n$ 144 is controlled to open and close by PWM_B, which responds to PWM_B_SD. Each of the switch $S_p$ 142 and the switch $S_n$ 144 may be implemented using a silicon transistor, such as a metal oxide field effect transistor (MOSFET) or an insulated gate bipolar transistor (IGBT) or silicon carbide MOSFET or Gallium nitrate (GaN), with the respective control signal PWM_T or PWM_B connected to its respective gate. In certain configurations of the inverter 104, the capacitors 138 and 140 can be replaced with power switches similar to the switch $S_p$ 142 and the switch $S_n$ 144. A positive side diode $D_p$ 146 has an anode connected to the third node 134 and a cathode connected to the first node 130. A negative side diode $D_n$ 148 has an anode connected to the second node 132 and a cathode connected to the third node 134. The combination of the switches $S_p$ 142 and $S_n$ 144 and the diodes $D_p$ 146 and $D_n$ 146 are referred to as half bridge circuit. A current sensor 150 is connected between the third node 134 and the load 106. The current sensor 150 is used for sensing a current, $i_L$, through the load 106 as described below, and in response the current sensor 150 outputs a corresponding signal, $i_L$_sense. The current sensor 150 in some examples can be connected on node 134 and in some example on node 136. In some other inverter configurations, like a three phase inverter, the current sensor can be connected to all output nodes.

The load 106 may take or include various electrical-driven forms, for which the VSI 100 drives the load with Vout. For example, the load 106 may be an electrical motor, driven by a single phase voltage, or in an alternative example, the half bridge circuit may be triplicated and with appropriate control provide three different continuous (e.g., sinusoidal) waveforms, each 120 degrees out of phase with respect to the other two waveforms driving a three phase motor. Specifically, as Vout varies as an approximate sinusoid, a fundamental current $i_L$ is generated through the load 106 having a generally same-shaped (e.g., sinusoidal) waveform, but $i_L$ may be phase shifted from Vout depending upon the load characteristics, which is a combination of inductance, resistance and capacitance to name a few. $i_L > 0$ is considered as a positive half-cycle and $i_L < 0$ is considered as a negative half-cycle. When the VSI 100 drives a motor as the load 106, the current sensor 150 is used to detect the current through the motor, so as to offer motor control like field orientation control, or for current limiting/protection purposes. Such a current sensor 150 may use a magnetic field generated by load current $i_L$ as a parameter to measure $i_L$ and produce $i_L$ sense in response. Such examples include hall based or flux gate based current sensors. Alternatively, an inline shunt resistor may be used along with an amplifier to measure the motor current $i_L$. The amplifier may or may not be isolated. In some examples, amplifiers also include delta sigma modulators. In all events, in the VSI 100, the current level sensed by the current sensor 150 is shown as $i_L$_sense, which is representative of the amount of $i_L$ through a portion of the load 106, and $i_L$_sense is coupled back to the controller 108, for example to its ADC 120. Accordingly, and as detailed below, this coupling provides feedback to the controller 108 (for example via its ADC 120) through which the controller 108 may measure the magnitude, direction, and slope of current $i_L$ in the load 106, and together with PWM_T_SD and PWM_B_SD to appropriately adjust the dead time insertion into the PWM signals that are driving that load 106.

Figure 2A:
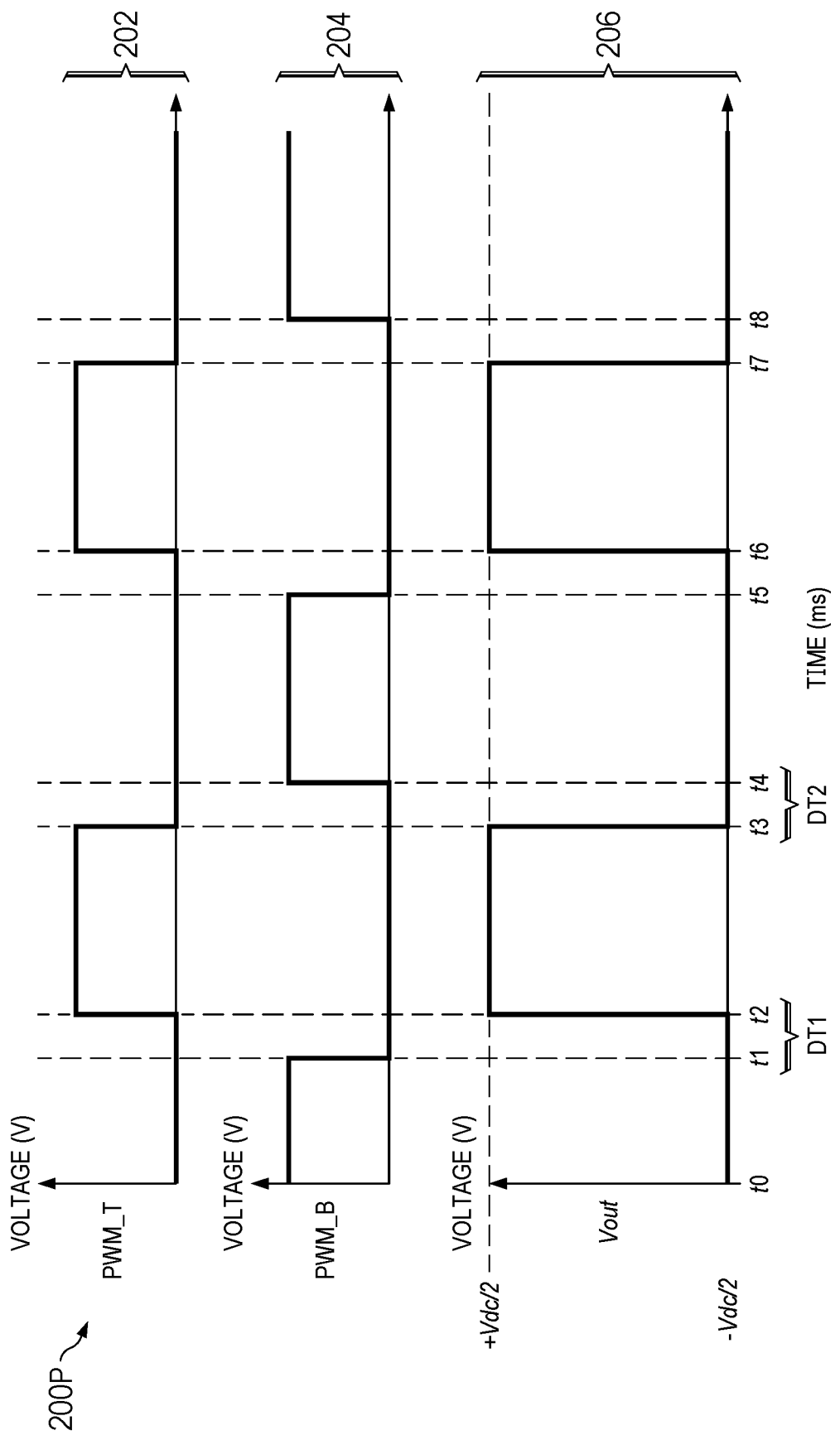
FIG. 2A illustrates a timing signal diagram of the PWM operation of the VSI during the positive half-period.

FIG. 2A illustrates a timing signal diagram 200P illustrating certain aspects of the PWM operation of the VSI 100 during the $i_L$ positive half-period, that is, when $i_L>0$. The timing signal diagram 200P includes three signals, each with a horizontal axis of time (e.g., ms) and a vertical axis of voltage (e.g., volts, not to scale). A first signal PWM_T_SD 202 represents the output of the first switch driver 110, a second signal PWM_B_SD 204 represents the output of the second switch driver 112, and a third signal 206 represents Vout, the output from the inverter 104 and applied across the load 106. Generally, the transitions in PWM_T_SD and PWM_B_SD (both shown in FIG. 1) cause corresponding, albeit some time delayed, responses in the FIG. 2 illustrated PWM_T and PWM_B, and in Vout, due to propagation delay of the switch driver and the delay associated with power switches. Further, as shown below, during the entire positive half-period, the operation of the switches 142 $S_p$ and $S_n$, and the alternative current path through the negative side diode $D_n$ 148, provide a same current path, which follows the positive polarity by the FIG. 1 convention.

Prior to t1 in FIG. 2A, PWM_B is high and closes (e.g., for a transistor, turning on) the negative side switch $S_n$ 144, current $i_L$ flows through the negative side switch $S_n$ 144 to the load 106 and Vout is $-Vdc/2$. At t1, PWM_B transitions from high to low, thereby opening (e.g., for a transistor, turning off) the negative side switch $S_n$ 144. Due to the inductive attributes (e.g., the inductor 106_L) of the load 106, the instantaneous current continues to flow in the same direction, now no longer through the negative side switch $S_n$ 144 but instead transitioning through the negative side diode $D_n$ 148 and continuing to flow in the positive direction, still retaining Vout at $-Vdc/2$. Also from t1 to t2, both the negative side switch $S_n$ 144 and the positive side switch $S_p$ 142 switches are open (in an off state), thereby providing a dead time DT1, and Vout continues to be at $-Vdc/2$. At t2, PWM_T transitions from low to high, thereby closing (turning on) the positive side switch $S_p$ 142. This results in Vout switching from $-Vdc/2$ to $+Vdc/2$ and current flows from Vdc through the positive side switch $S_p$ 142 to the load 106. At t3, PWM_T transition from high to low, turning off the positive side switch $S_p$ 142, while the negative side switch $S_n$ 144 remains off, beginning a dead time DT2, and here again the current direction continues flowing into the inductive load 106, transitioning from the positive side switch $S_p$ 142 to the negative side diode $D_n$ 148, while Vout at t3 transitions from $+Vdc/2$ to $-Vdc/2$ and continues be at this value until t6. Particularly, at t4, PWM_B transitions to a high value (as it was preceding t1), closing the negative side switch $S_n$ 144, so current flows through that switch to the load 106. At t5, PWM_B transitions from high to low, starting a next dead time (not expressly labeled), and the preceding process repeats as described above.

From the preceding, during the positive half-cycle, the controller 108 outputs signals PWM_T_SD and PWM_B_SD, and the respective inputs PWM_T and PWM_B to the inverter 104, such that only one of PWM_T_SD and PWM_B_SD is asserted (active high) at a time. Further, Vout toggles between rails, and the duty cycle greater than 50% keeps the average Vout positive and it, continues to flow in a same direction (positive polarity by the FIG. 1 convention). Particularly, any inductive portion of the load 106, which is anticipated to be included where the load 106 is a motor with a conductive path that includes an inductance, resists a sudden change in current due to its stored magnetic energy. Accordingly, during the positive half-cycle and when PWM_T is de-asserted (and consequently the positive side switch $S_p$ 142 is open) during each of the dead times DT1 or DT2, it, continues to flow through the negative side diode $D_n$ 148. Essentially, in the positive half-cycle, Vout aligns with the pulse width of PWM_T and Vout is high ($+Vdc/2$) when PWM_T is asserted. The dead time pattern repeats for each PWM period, For instance, t5, t6 in FIG. 2 corresponds to t1, t2 and t3, t4 corresponds to t7, t8, and so on. In all events, nominally a minimum period of the dead time, that is, when both PWM_T and PWM_B are both de-asserted (and the positive side switch $S_p$ 136 and negative side switch $S_n$ 138 are open), may be set to ensure safe operation, without shoot-through, based on the device and operational attributes of the circuit that provides the switching, for example including propagation delay through the first and second switch driver 110 and 112, as well as the delay and rise/fall time of the transistors (MOSFET, IGBT) that implement the switches $S_p$ 136 and $S_n$ 138. As shown below, however, an example is further provided to adaptively, and favorably, adjust the nominal dead time, in response to the feedback it receives relating to the sensing of $i_L$ through the load 106.

Figure 2B:
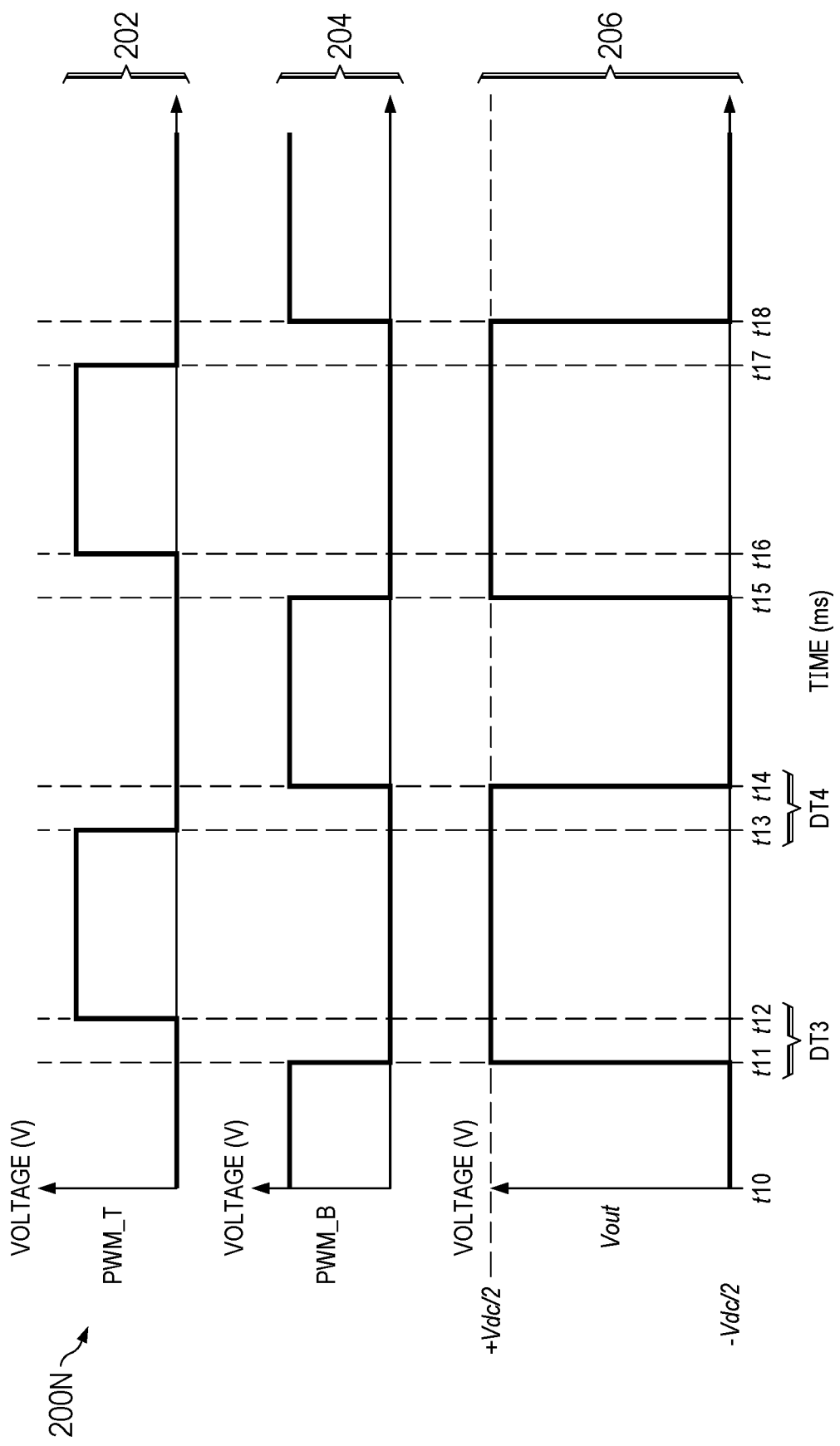
FIG. 2B illustrates a timing signal diagram of the PWM operation of the VSI during the negative half-period.

FIG. 2B illustrates a timing signal diagram 200N illustrating the PWM operation of the VSI 100 during the $i_L$ negative half-period, that is, when $i_L<0$. The timing signal diagram 200N includes the same three signals as in FIG. 2A, but with each in FIG. 2B corresponding to the negative $i_L$ half-period. Generally, the first two signals 202 and 204 are unchanged from FIG. 2A, while the third signal 206, again representing Vout, differs due to the effects occurring in the negative half-period, as further detailed below.

Prior to t11 in FIG. 2B, PWM_B is high, load current $i_L$ flows through load to the negative side switch $S_n$ 144 and Vout is $-Vdc/2$. At t11, PWM_B transitions from high to low, thereby turning off the negative side switch $S_n$ 144. The current flowing in the negative side switch $S_n$ 144 transitions to the positive side diode $D_p$ 146 due to the inductive nature of the load 106 and continues to flow in the negative direction, making Vout transition from $-Vdc/2$ to $+Vdc/2$. Between t11 and t12, both the positive side switch $S_p$ 142 and the negative side switch $S_n$ 144 are in an off state and provide a dead time DT3. Also between t11 and t12, Vout continues to be at $+Vdc/2$. At t12, PWM_T transitions from low to high, thereby turning on the positive side switch $S_p$ 142. This results in current transitioning from the positive side diode $D_p$ 146 to the positive side switch $S_p$ 142 and Vout continues to be at $+Vdc/2$. At t13, PWM_T transitions from high to low, turning off the positive side switch $S_p$ 142 and the current $i_L$ transitions from the positive side switch $S_p$ 142 to the positive side diode $D_p$ 146. Vout continues to be at +Vdc/2 until t14, where PWM_B is made high. Between t13 and t14, both the positive side switch $S_p$ 142 and the negative side switch $S_n$ 144 are off, providing a dead time DT4.

From the preceding, during the negative half-cycle, the controller 108 again outputs signals PWM_T_SD and PWM_B_SD, and the respective inputs PWM_T and PWM_B to the inverter 104, such that only one of PWM_T_SD and PWM_B_SD is asserted (active high) at a time. Further, Vout toggles between rails, and the duty cycle lesser than 50% keeps the average Vout negative and $i_L$ continues to flow in a same direction (negative polarity by the FIG. 1 convention). Again, any inductive portion of the load 106, which is anticipated to be included where the load 106 is a motor with a conductive path that includes an inductance, resists a sudden change in current due to its stored magnetic energy. Accordingly, during the negative half-cycle and when PWM_B is de-asserted (and consequently the negative side switch $S_n$ 144 is open) during each of the dead times DT3 or DT4, $i_L$ continues to flow through the positive side diode $D_p$ 146. Essentially, in the negative half-cycle, Vout aligns with the pulse width of PWM_B and Vout is high (+Vdc/2) when PWM_B is de-asserted. The dead time pattern repeats for each PWM period. For instance, t15, t16 in FIG. 2B correspond to t11, t12 and t17, t18 correspond to t13, t14, and so on. In all events, nominally a minimum period of the dead time, that is, when both PWM_T and PWM_B are both de-asserted (and the positive side switch $S_p$ 136 and negative side switch $S_n$ 138 are open), may be set to ensure safe operation, without shoot-through, based on the device and operational attributes of the circuit that provides the switching, for example including propagation delay through the first and second switch driver 110 and 112, as well as the delay and rise/fall time of the transistors (MOSFET, IGBT) that implement the positive side switch $S_p$ 136 and negative side switch $S_n$ 138. As shown below, however, an example is further provided to adaptively, and favorably, adjust the nominal dead time, in response to the feedback it receives relating to the sensing of $i_L$ through the load 106.

Figure 3A:
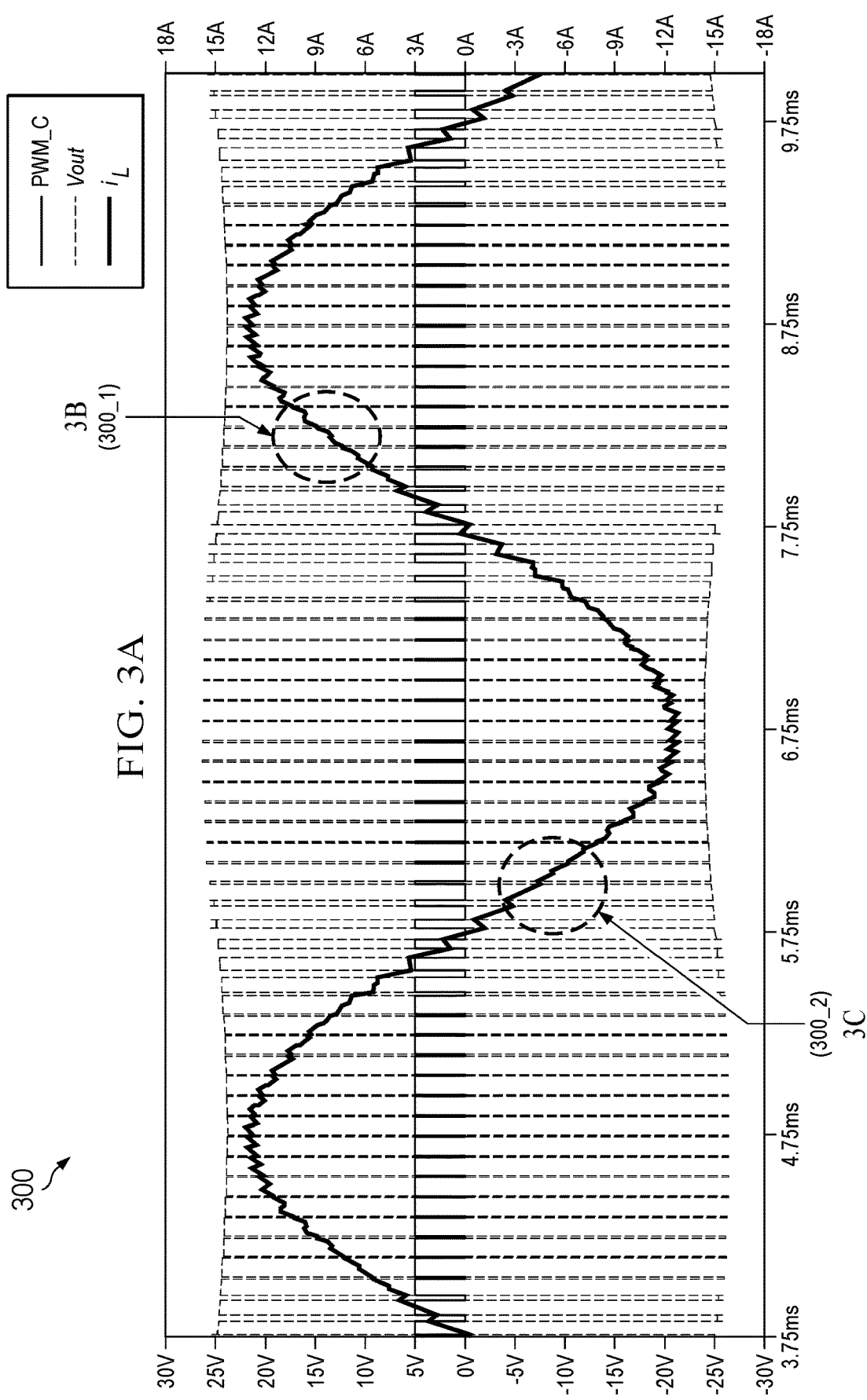
FIG. 3A illustrates a timing signal diagram illustrating additional PWM operation of the VSI.

FIG. 3A illustrates a timing signal diagram 300 illustrating additional PWM operation of the VSI 100. In FIG. 3A, a first dashed oval indicates a first time excerpted section 300_1, which is further detailed in FIG. 3B. Also in FIG. 3A, a second dashed oval indicates a second time excerpted section 300_2, which is further detailed in FIG. 3C. Generally in FIG. 3A, the timing signal diagram 300 (and excerpted sections 300_1 and 300_2) illustrates time (e.g., ms) along the horizontal axis, voltage (e.g., volts) on the left vertical axis, and current (e.g., amps) on the right vertical axis. Further, three signals are shown, all from earlier Figures and referenced in the FIGS. 3A-3C LEGEND, including PWM_C, Vout, and $i_L$, with the left vertical axis of volts pertaining to PWM_C and Vout, and the right vertical axis of amps pertaining to $i_L$. Generally, FIG. 3A illustrates approximately two full cycles of $i_L$, while FIG. 3B illustrates a portion of $i_L$ occurring during just over one period of PWM_C as $i_L$>0, that is, during the $i_L$ positive half-cycle, and FIG. 3C illustrates a portion of $i_L$ occurring during just over one period of PWM_C as $i_L$<0, that is, during the $i_L$ negative half-cycle.

Figure 3B:
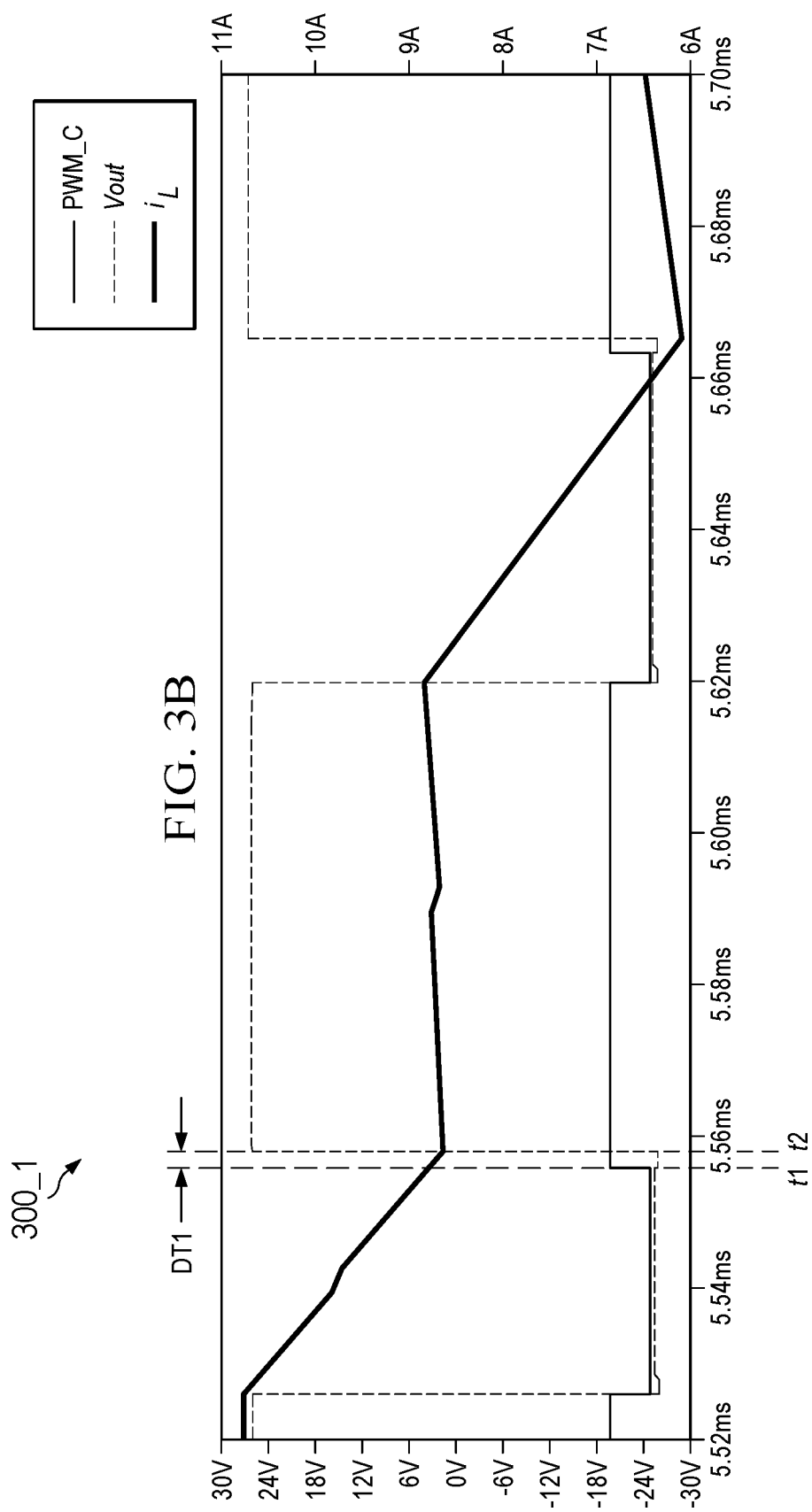
FIG. 3B illustrates a time period excerpted from the positive half-cycle of FIG. 3A.
Figure 3C:
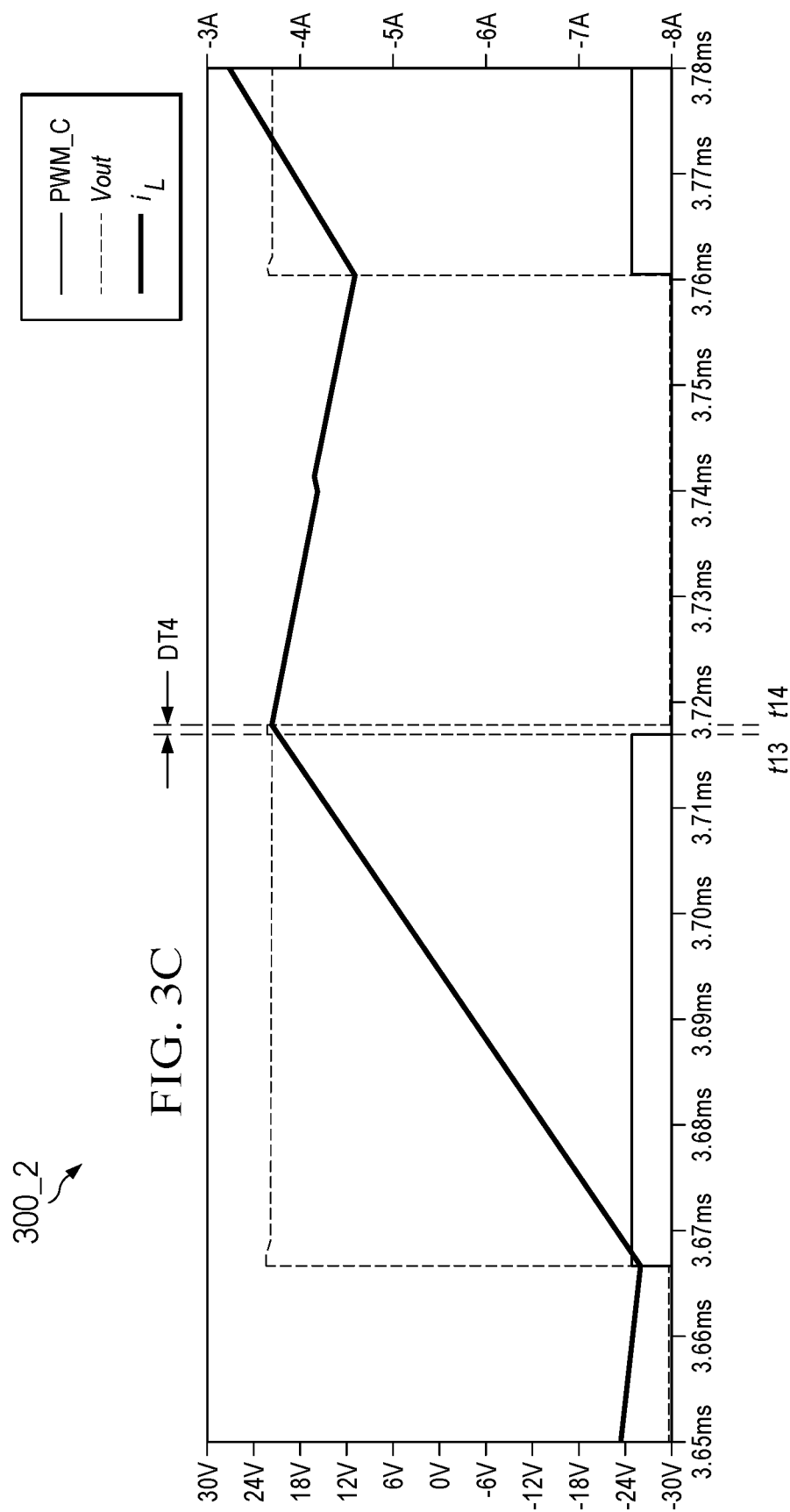
FIG. 3C illustrates a time period excerpted from the negative half-cycle of FIG. 3A.

Each of FIGS. 3A through 3C further elaborates with respect to the VSI 100 adaptive dead time adjustment. The VSI 100 operates, in part, with recognition as to the relationship of changes in $i_L$, which as illustrated in FIG. 3A is not only piecewise linear in its approximation of a continuous waveform, but it has further transitions in relation to certain transitions of PWM_C and Vout. Generally, the enlargements of FIGS. 3B and 3C each illustrate that during a period when both PWM_C is asserted and Vout is relatively high, $i_L$ rises, and when both PWM_C is de-asserted and Vout is relatively low, $i_L$ falls. As detailed below, however, FIG. 3B further elaborates with respect to the positive half-cycle $i_L$ behavior during the FIG. 2A dead time DT1, between a rising transition of PWM_C and the rise in Vout, while FIG. 3C further elaborates with respect to the negative half-cycle $i_L$ behavior during the FIG. 2B dead time DT4, between a falling transition of PWM_C and the fall in Vout.

FIG. 3B illustrates a first signal excerpt 300_1 from FIG. 3A, enlarging the horizontal time scale to further illustrate $i_L$ behavior during a portion of the $i_L$ positive half-cycle. In FIG. 3B, the FIG. 2A dead time DT1 is illustrated, which occurs between the rising transition of PWM_C and the rising transition in Vout. During the dead time DT1, however, the immediately-preceding decreasing behavior of $i_L$ continues, until DT1 ends, that is, until Vout transitions from low to high, at which point $i_L$ no longer decreases, that is, its trajectory either flattens in value or begins to increase. Accordingly, and as shown and detailed below, the VSI 100 structure provides functionality to monitor $i_L$ and detect this trajectory change, relative to the trajectory at the time of the immediately-preceding rise in PWM_C, thereby detecting the end and beginning, respectively, of the dead time DT1.

FIG. 3C illustrates a second signal excerpt 300_2 from FIG. 3A, enlarging the horizontal time scale to further illustrate $i_L$ behavior during a portion of the $i_L$ negative half-cycle. In FIG. 3C, the FIG. 2B dead time DT4 is illustrated, which occurs between the falling transition of PWM_C and the falling transition in Vout. During the dead time DT4, however, the immediately-preceding increasing behavior of $i_L$ continues, until DT4 ends, that is, until Vout transitions from high to low, at which point $i_L$ no longer increases, that is, its trajectory either flattens in value or begins to decrease. Accordingly, and as shown and detailed below, the VSI 100 structure provides and functionality to monitor $i_L$ and detect this trajectory change, relative to the immediately-preceding fall in PWM_C, thereby detecting the end and beginning, respectively, of the dead time DT4.

Figure 4:
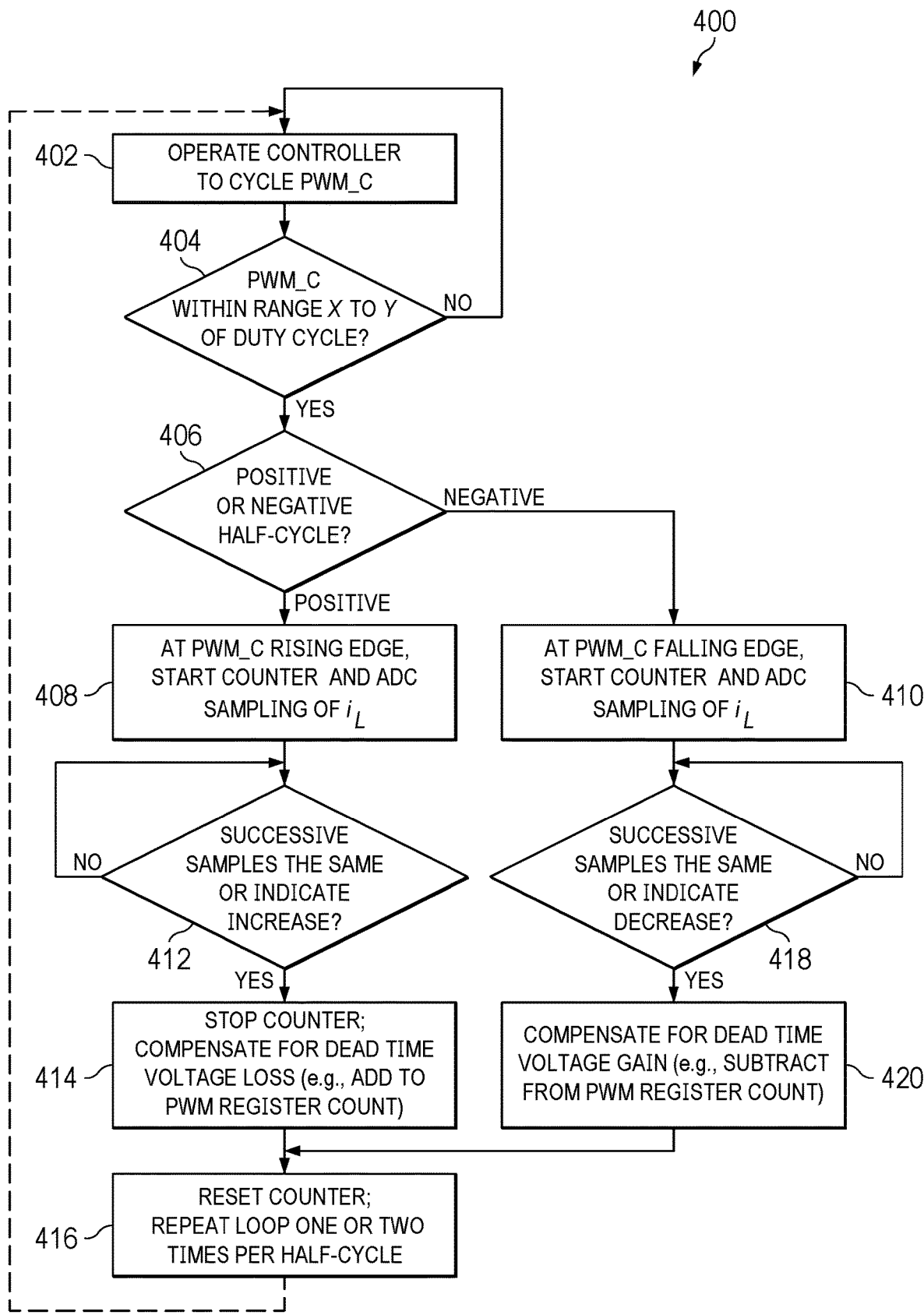
FIG. 4 is a flowchart of a PWM method of operation for the FIG. 1 VSI.

FIG. 4 is a flowchart of a PWM method 400 of operation for the FIG. 1 VSI 100.

Generally, the PWM method 400 may be implemented by program executed by the controller 108, which in response outputs PWM_T and PWM_B to the half-bridge circuit of the inverter 104, and in response to $i_L$ sense from the inventor 104 to adaptively adjusts the dead time included in the duration of each PWM_T and PWM_B pulse, so as to improve performance of the VSI 100. A flowchart is used to generally illustrate certain steps, but is not intended as a limitation, as steps may overlap rather than occur purely sequentially, or they may be added, removed, re-arranged, or the change of process (or state) may be implemented in various forms. In the provided illustration, the PWM method 400 commences with a step 402, in which the controller 108 operates to output PWM_C, so that generally PWM_C transitions as described above, with duty cycle at greater than 50% to output Vout=+Vdc/2 for relatively longer periods resulting in an $i_L$ positive half-cycle, and with duty cycle less than 50% to output Vout=−Vdc/2 for relatively longer periods resulting in an $i_L$ negative half-cycle. In the example of FIG. 1, the step 402 may be achieved through the CPU 114 writing the required pulse width to be generated by the PWM peripheral 124.

A step 404 evaluates the PWM_C duty cycle as a condition of next action. The step 404 may operate concurrently with the step 402, so that as the step 402 adjusts and outputs the PWM_C pulses, the step 404 checks the duty cycle over such pulses. Particularly, the step 404 determines whether the PWM_C duty cycle is within a range between X and Y percent, for example with X=40% and Y=60%. Returning to FIG. 3A, note for example that as duty cycle falls within this range, 40%<duty cycle <60%, $i_L$ is relatively near to its zero-crossing point, that is $i_L$=0 A, which occurs between its positive and negative half-cycles. Accordingly, the step 404 conditional check determines whether PWM_C represents a duty cycle such that $i_L$ is relatively near to its zero-crossing point, with the relative measure defined by the values of X and Y, where the range between them can be expanded or reduced, as appropriate. If the PWM_C duty cycle is outside the indicated range, the method 400 returns to the step 402 (and continues to be monitored by the step 404), whereas if the PWM_C duty cycle is within the indicated range, then the method continues to a step 406. The indicated range is a function of performance of the sensor, ADC, and slope detector in accurately detecting the change in slope of the load current. Subsequently, the range can be extended or shortened to facilitate detection of change in slope of the load current.

The step 406 evaluates whether $i_L$ is in its positive half-cycle (e.g., FIG. 3B) or its negative half-cycle (e.g., FIG. 3C), and directs the method flow in response. Accordingly, if $i_L$ is in its positive half-cycle, as shown as the first time excerpted section 300_1 from FIG. 3A and FIG. 3B, then the method 400 proceeds to a step 408, whereas if $i_L$ is in its negative half-cycle, as shown as the second time excerpted section 300_2 from FIG. 3A and FIG. 3C, then the method 400 proceeds to a step 410.

The step 408 takes two actions at the next PWM_C rising edge. As a first action, the step 408 commences a count, for example in the FIG. 1 counter 122, where the increasing count will represent a time measurement. For example and returning to the FIG. 3B illustration during the positive half-cycle, in the step 408, the CPU 114 starts the counter at t1, with the rising edge of PWM_C. As a second action, the step 408 also begins sampling $i_L$, for example in FIG. 1 by the ADC 120 in the feedback it receives from $i_L$ sense. The number of samples and sampling interval are configurable and may also include averaging between samples to improve current sense accuracy. Next, the method 400 proceeds from the step 408 to a step 412.

The step 412 is a conditional step based on the ADC samples of $i_L$ sense, and that loops, by returning to the step 412, so long as those ADC sample values continue to decrease. Again by example in the FIG. 3B illustration, with the step 408 having commenced ADC sampling of $i_L$_sense at t1, note that with step 412 applied to those samples, then starting at t1, $i_L$_sense continues to decrease, until t2. Accordingly, for this duration between t1 and t2, the step 412 will continue to return to the step 412, as the periodic ADC sampling indicates a continuing decrease in $i_L$_sense. At t2, however, successive ADC samples will indicate a trajectory change, either by a same successive value as $i_L$_sense flattens, or a reversal in which one sample value will increase over the immediately preceding sample value. This change in condition is detected by the step 412, as at this point the samples are no longer decreasing, but instead are constant or are increasing. Note also such a conditional change occurs at the end of DT1, that is, detection of this change is a detection of the end of the dead time. Once this condition is detected, the CPU 114 stops the counter 122 and the step 412 directs method 400 to a step 414.

The step 414 is reached after the method 400 has detected the end of a dead time that follows a rising transition in PWM_C. When reaching the step 414, the method 400 also will have accrued a time measurement, in the form of the count in the counter 122, of the actual duration of that dead time. In this regard, note that dead time is typically set to a maximum value, that is one to be met under an anticipated set of conditions, and that is sufficiently long to ensure the goal of avoiding shoot-through. The maximum value is commonly established based on various considerations, for example including the delay through the switching devices of the PWM architecture, which in the VSI 100 includes the switches in the first and second switch drivers 110 and 112, and in the inverter 104 (e.g., switches $S_p$ and $S_n$). Additionally, the maximum dead time is typically extended by a safety margin to account for the unpredictability or unknowability of certain factors, for example due to fabrication, parametric, and environmental variations from device to device, among other things. While the dead time provides value in avoiding shoot-through, there is a tradeoff in that, during a positive half-cycle, for example as shown in FIG. 3B, it, continues to decline and Vout remains low, so as a result there is voltage loss and/or distortion in the sense of contribution to the continuity of Vout as a sinusoid. Accordingly, the longer the safety margin imposed by the conservative setting of the dead time, the greater the corresponding signal quality degradation during that dead time. In the VSI 100, however, and having reached the step 414, there is a time measure of actual dead time, rather than the nominal one, as detected by the step 412 change in it, trajectory and the accumulated count over the dead time. Accordingly, when the method 400 reaches the step 414, it has accrued a measure of actual dead time, in contrast to the designed maximum dead time. In response, the step 414 can compensate for excessive voltage loss, for example if actual dead time is less than maximum dead time configured in the dead band generator 126, then its value can be reprogrammed to reflect the actual measured dead time. Further, the CPU 114 adds the measured dead time to the computed pulse width PWM_C to account for the voltage loss. This results in better quality output voltage Vout from the inverter 104. Accordingly, without further changes, the subsequent positive half-cycle assertions of PWM_C are controlled in response to the actual dead time measured. Next, the method 400 continues to the step 416.

The step 416 represents a potential return to step 402, so as to repeat the preceding steps. For example, in the step 416, the counter 122 may be reset and flow can be returned to the step 402, as shown by a dashed arrow in FIG. 4. In an example, the number of times the steps are repeated may be fixed or adjustable, and in certain examples the steps repeat only once per cycle of $i_L$. In this manner, the method 400 need not occupy processing or other resources during most of an $i_L$ cycle, yet be evaluating once per cycle can be sufficient to improve operation, voltage loss, and signal distortion. Additionally, since the steps occur (or repeat) only when PWM_C is within the duty cycle range set by X and Y (e.g., 40% to 60%), note that in such a range the sensitivity to detecting changes in $i_L$ trajectory are enhanced, as any such change is of larger magnitude in that range, as is visible from the discontinuities illustrated in $i_L$ in FIG. 3A as $i_L$ is within such a range (and approaches the zero-crossing point).

With the preceding describing the method 400 following a step 406 detection of a positive half-cycle, recall that the method 400 proceeds to the step 410 following a step 406 detection of a negative half-cycle. The step 410, and the steps 418 and 420 following it, are comparable in certain respects to steps 408, 412, and 414, although the detection trajectory directionality of $i_L$ is reversed, as is the count correction in the step 420.

The step 410 takes two actions at the next PWM_C falling edge. As a first action, the step 410 commences a count, thereby accruing a time measurement (again for example using the FIG. 1 counter 122), and as a second it begins sampling $i_L$ (again for example sampling $i_L$_sense by the ADC 120). These actions may be taken, for example relative to FIG. 3C, during the negative half-cycle and commencing the count and sampling at t13, with the falling edge of PWM_C.

Next, the step 418 conditionally loops, by returning to the step 418, so long as the $i_L$_sense ADC samples continue to increase. Again, by example in FIG. 3C, with the step 410 having commenced ADC sampling of $i_L$_sense at t13, note that with step 418 applied to those samples, then starting at t13, $i_L$_sense continues to increase, until t14. Accordingly, for this duration between t13 and t14, the step 418 will continue to loop as the periodic ADC sampling indicates a continuing increase in sample values. At t14, however, successive ADC samples will indicate a trajectory change, either in a same successive value as $i_L$_sense flattens or a reversal by which one sample value will decrease over the immediately preceding sample value. This change in condition is detected by the step 418, as at this point the samples are no longer increasing, but instead are constant or are decreasing, which occurs at the end of DT4, thereby detecting the end of the dead time. Once this condition is detected, the CPU 114 stops the counter 122 and the step 418 directs method 400 to the step 420.

The step 420 is reached after the method 400 has detected the end of a dead time that follows a falling transition in PWM_C, and when reaching the step 420 the method 400 also will have accrued a time measurement, in the form of the count in the counter 118_CTR, of the actual duration of that dead time. Here again, the accrued dead time measurement is an actual dead time measure in contrast to a nominal value, and like step 414 above, can be used for compensating undesirable voltage distortion and gain that could arise from overly conservative, or device independent, nominal dead time imposition. Indeed, in the case of a negative half-cycle, FIG. 3C illustrates that Vout remains high during the dead time, thereby extending the voltage pulse beyond what is ideal in order to smoothly approximate the desired $i_L$ sinusoid. Accordingly, the step 420 can compensate for the extended voltage period (in effect, a voltage gain), for example by subtracting from the PWM register count. In response, the step 420 can compensate for excessive voltage gain, for example if actual dead time is less than maximum dead time configured in the dead band generator 126, then its value can be reprogrammed to reflect the actual measured dead time. Further, the CPU 114 subtracts the measured dead time to the computed pulse width PWM_C to account for the voltage gain. This results in better quality output voltage Vout from the inverter 104. Accordingly, without further changes, the subsequent negative half-cycle assertions of PWM_C are controlled in response to the decreased count. Next, the method 400 continues to the step 416, which operates as earlier described.

Figure 5:
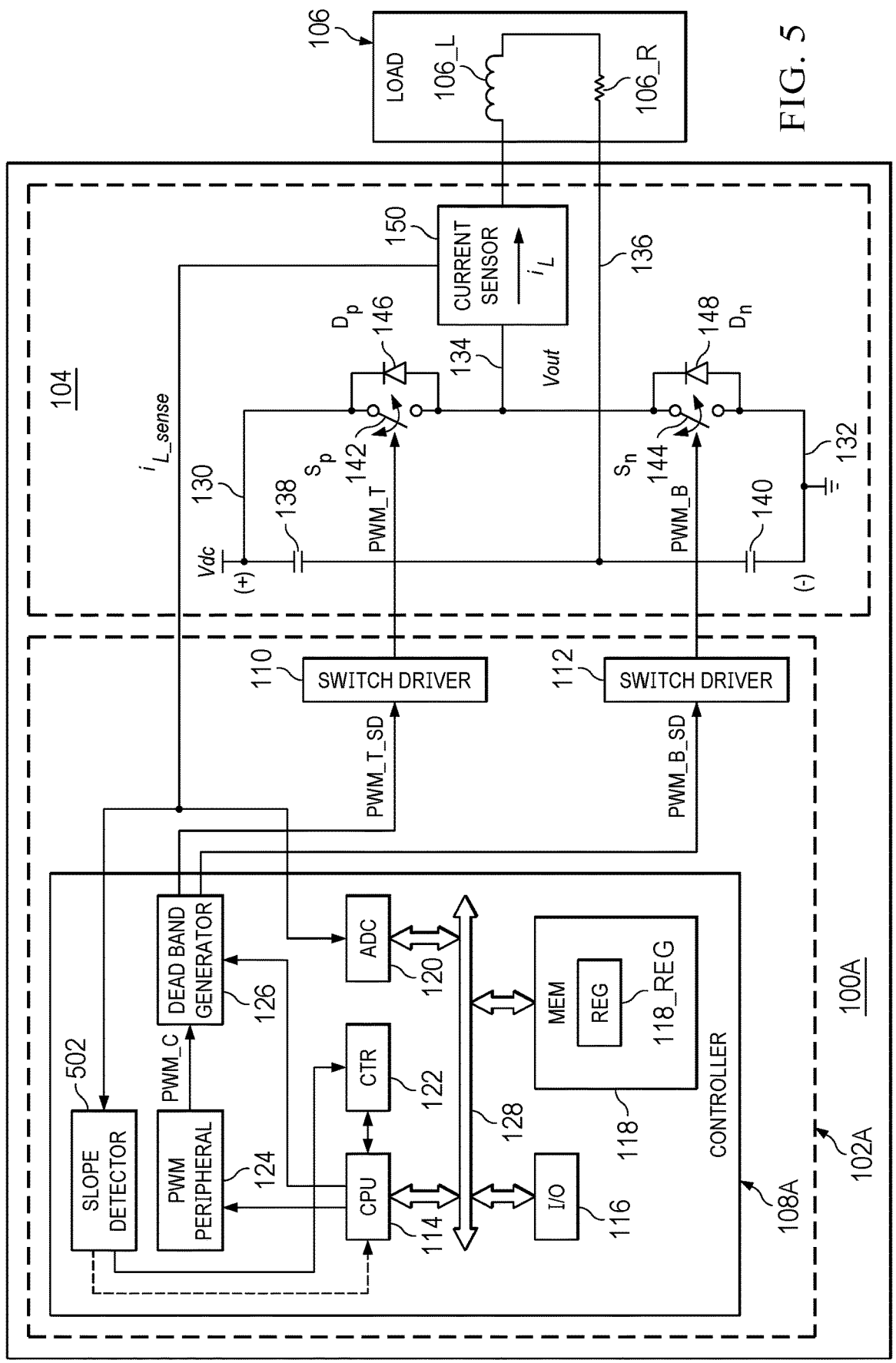
FIG. 5 illustrates an alternative example VSI.

FIG. 5 illustrates an alternative example VSI 100A, which is the same as the FIG. 1 VSI 100, except that the FIG. 1 controller 108 is shown as an alternative example controller 108A. The controller 108A includes an additional slope detector 502, which is coupled to CPU 114 and the counter 122, and it also is coupled to receive the feedback current value $i_L$_sense, rather than (or in addition to) that value being coupled the ADC 120. In this regard, the controller 108A has the slope detector 502 as integrated (and potentially dedicated) hardware for performing the functions of the FIG. 4 steps 412 and 418, that is, in either of those steps, what was described above as a trajectory in value, as earlier monitored by ADC values, also corresponds to a change in slope, for example as visible in the FIGS. 3A-3C illustrations. Accordingly, in FIG. 5, the slope detector 502 is operable to detect when the slope flattens or changes to begin increasing in the step 412, or similarly when the slope flattens or changes to being a decrease in the step 418. In either instance, the slope detector 502 may indicate such a detection event to the CPU 114 (e.g., by interrupt or setting a CPU-monitored flag in the memory 118), and the CPU 114 can respond according to the remaining FIG. 4 steps. Alternatively, as shown by a dashed line in FIG. 5, the slope detector 502 could indicate such a detection event directly to the CPU 114 and stop the counter 122. In some examples, the counter 122 can be started by the CPU 114 and stopped by the slope detector 502. In other examples, the counter 122 can be started and stopped by the CPU 114. The CPU 114 also resets the counter 122 to zero after reading the count value From the above, described examples provide electronic circuitry that include a pulse width modulator with adaptive dead time adjustment. Such electronic circuitry may be implemented in power conversion/power converters, and may be used in numerous applications and could fulfill long term needs as power conversion products are anticipated as an ongoing and prolific market need. Examples of such applications includes industrial devices, servo drives, solar inverters, uninterrupted power supplies, heating, ventilation, and air conditioning, elevators, and so forth. The adaptive PWM can avoid shoot-through, adapt for device parameter variations, and improve voltage gain/loss and distortion. Further, the adaptive PWM may be implemented, for example, without an external voltage sensor and in many instances utilizing a sensor already included in a load driven in the system, for example when the load is a motor that includes a current sensor, and also hardware on a microcontroller, such as an included ADC or slope detector. Accordingly, product and system performance is enhanced, with reduced cost and/or complexity. As another benefit, additional modifications are possible in the described embodiments, and other embodiments are possible, within the scope of the following claims.

What is claimed is:

1. A pulse width modulator circuit comprising:
   circuitry for providing first and second pulse width modulation signals with dead time periods between the first and second pulse width modulation signals;
   an input for receiving a signal representative of a current in a load adapted to be driven in response to the first and second pulse width modulation signals; and
   circuitry coupled to the input for adjusting the dead time periods in response to the signal representative of a current.

2. The pulse width modulator circuit of claim 1 wherein the circuitry for providing a pulse width modulation signal and the circuitry for adjusting the dead time periods include a controller.

3. The pulse width modulator circuit of claim 1 wherein the circuitry for adjusting the dead time periods include an analog-to-digital converter.

4. The pulse width modulator circuit of claim 3 wherein the circuitry for adjusting the dead time periods further include a central processing unit.

5. The pulse width modulator circuit of claim 1 wherein the circuitry for adjusting the dead time periods include a central processing unit.

6. The pulse width modulator circuit of claim 1 wherein the circuitry for adjusting the dead time periods include circuitry for detecting a change in trajectory of the signal representative of a current.

7. The pulse width modulator circuit of claim 6 wherein the circuitry for detecting a change in trajectory include an analog to digital converter.

8. The pulse width modulator circuit of claim 6 wherein the circuitry for detecting a change in trajectory includes a slope detector integrated into a controller.

9. The pulse width modulator circuit of claim 6 wherein the circuitry for detecting a change in trajectory includes:
circuitry for detecting a change from a decrease in the signal representative of a current during a first half-cycle of a full cycle of the current in the load; and
circuitry for detecting a change from an increase in the signal representative of a current during a second half-cycle of the full cycle of the current in the load.

10. The pulse width modulator circuit of claim 1 wherein the circuitry for adjusting the dead time periods include:
a pulse width modulator peripheral for generating a pulse width modulation control signal, in response to which the first and second pulse width modulation signals are generated;
a counter; and
circuitry coupled to the counter for starting the counter in response to a transition of the pulse width modulation control signal and stopping the counter in response to a change in trajectory of the signal representative of a current.

11. The pulse width modulator circuit of claim 10 wherein the transition is a low-to-high transition during a positive half-cycle of the current in a load.

12. The pulse width modulator circuit of claim 10 wherein the transition is a high-to-low transition during a negative half-cycle of the current in a load.

13. The pulse width modulator circuit of claim 1 and further including:
an output for coupling an output voltage to the load, the current in the load responsive to the output voltage;
a pulse width modulator peripheral for generating a pulse width modulation control signal, in response to which the first and second pulse width modulation signals are generated; and
circuitry for measuring actual dead time between a transition of the pulse width modulation control signal and a transition of the output voltage.

14. The pulse width modulator circuit of claim 13 and further including circuitry for detecting the transition of the output voltage in response to a change in trajectory of the signal representative of the current.

15. The pulse width modulator circuit of claim 13 wherein the circuitry for providing a first and second pulse width modulation signal adjusts at least a first dead time period, in the dead time periods, in response to a measure of the actual dead time.

16. A pulse width modulator system comprising:
circuitry for providing first and second pulse width modulation signals with dead time periods between the first and second pulse width modulation signals;
an input for receiving a signal representative of a current in a load adapted to be driven in response to the first and second pulse width modulation signals;
circuitry coupled to the input for adjusting the dead time periods in response to the signal representative of a current;
a first switch driver adapted to receive the first pulse width modulation signal;
a second switch driver adapted to receive the second pulse width modulation signal;
a first switching circuit coupled to an output of the first switch driver; and
a second switching circuit coupled to an output of the second switch driver.

17. The pulse width modulator system of claim 16 and further including:
an output for coupling an output voltage to the load, the current in the load responsive to the output voltage; and
a current sensor coupled to the output and operable to provide the signal representative of a current.

18. The pulse width modulator system of claim 16 and further including:
an output for coupling an output voltage to the load, the current in the load responsive to the output voltage;
a pulse width modulator peripheral for generating a pulse width modulation control signal, in response to which the first and second pulse width modulation signals are generated; and
circuitry for measuring actual dead time between a transition of the pulse width modulation control signal and a change in trajectory of the signal representative of the current.

19. A method of operating a pulse width pulse width modulator circuit comprising:
providing first and second pulse width modulation signals with dead time periods between the first and second pulse width modulation signals;
receiving a signal representative of a current in a load adapted to be driven in response to the first and second pulse width modulation signals; and
adjusting the dead time periods in response to the signal representative of a current.

20. The method of claim 19 wherein the adjusting step includes adjusting the dead time periods in response to a change in trajectory of the signal representative of a current.

* * * * *